United States Patent [19]
Katsuda et al.

[11] Patent Number: 6,156,686
[45] Date of Patent: Dec. 5, 2000

[54] POROUS COMPOSITE CERAMIC SINTERED BODIES AND A PRODUCTION PROCESS THEREOF

[75] Inventors: Yuji Katsuda, Tsushima; Kiyoshi Araki, Nagoya; Tsuneaki Ohashi, Ogaki, all of Japan

[73] Assignee: NGK Insulators, Ltd., Nagoya, Japan

[21] Appl. No.: 09/206,509

[22] Filed: Dec. 7, 1998

[30] Foreign Application Priority Data

Dec. 10, 1997 [JP] Japan ................................. 9-356343

[51] Int. Cl.[7] ................................................. C04B 35/581
[52] U.S. Cl. ......................................... 501/96.1; 501/153
[58] Field of Search ..................... 501/96.1, 15.3

[56] References Cited

U.S. PATENT DOCUMENTS

| | | | |
|---|---|---|---|
| 4,720,362 | 1/1988 | Gentilman et al. | 264/1.2 |
| 4,788,167 | 11/1988 | Mathers et al. | 501/102 |
| 5,514,630 | 5/1996 | Willkens et al. | 501/89 |

FOREIGN PATENT DOCUMENTS

| | | |
|---|---|---|
| 000107571 | 5/1984 | European Pat. Off. . |
| 5-246775 | 9/1993 | Japan . |
| 6-327921 | 11/1994 | Japan . |

Primary Examiner—Paul Marcantoni
Attorney, Agent, or Firm—Burr & Brown

[57] ABSTRACT

A porous composite ceramic sintered body includes an aluminum nitride phase and an aluminum oxynitride phase.

2 Claims, 4 Drawing Sheets

FIG._2

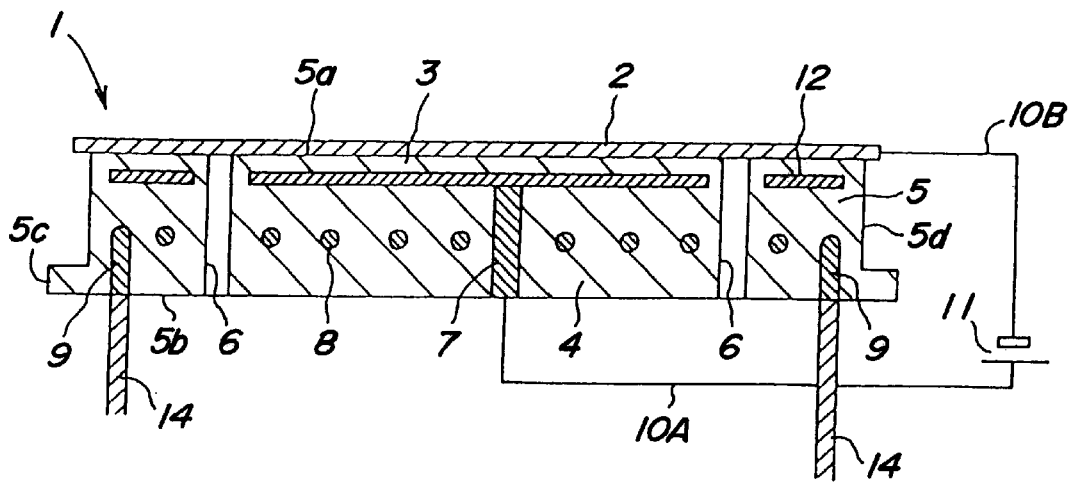
FIG_5
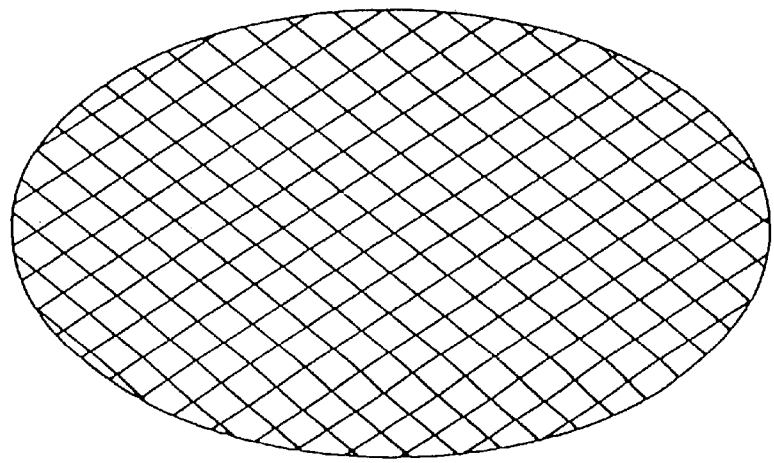
FIG_6

POROUS COMPOSITE CERAMIC SINTERED BODIES AND A PRODUCTION PROCESS THEREOF

BACKGROUND OF THE INVENTION (1) Field of the Invention

The present invention relates to composite ceramic sintered bodies. More particularly the invention relates to porous composite ceramic sintered bodies to be suitably used as electric materials, structural materials, and ceramic products such as filters. The invention also relates to a process for producing the same.

(2) Related Art Statement

Since aluminum nitride ceramics have various properties such as high heat resistance, high electric insulation, high heat conductivity and high corrosion resistance, aluminum nitride ceramics have been formerly used as electric materials for semiconductor heat-emitting plates and circuit boards, structural materials for members in semiconductor producing apparatuses, and filters disclosed in JP-A-5-246,775 and JP-A-6 327,921.

In order to use such an aluminum nitride ceramic material for a filter, as described in JP-A-5 246,775 and JP-A-6 327,921, a technique is proposed where carbon or an organic foaming agent is preliminarily mixed into the aluminum nitride ceramic material, which is sintered to make the resulting product porous by removing the additive.

However, such a porous aluminum nitride ceramic product must be produced at a sintering temperature lower than that at which a dense bulky aluminum nitride product is produced.

Therefore, the above technique has problems in that sintering is insufficient, which makes heat conductivity and heat impact resistance lower. Further, since strength and toughness drop, machinability are deteriorated.

Further, there is other problem in that ammonia having pungent smell is generated through reaction between aluminum nitride and moisture in air.

SUMMARY OF THE INVENTION

It is an object of the present invention to provide a porous composite ceramic sintered body having excellent heat impact resistance and excellent machinability without generating a pungent smell substance such as ammonia.

The present invention relates to a porous composite ceramic sintered body comprising an aluminum nitride phase and an aluminum oxynitride phase.

The present invention further relates to a process for producing a porous composite ceramic sintered body, comprising the steps of: mixing a powder of aluminum nitride and a carbon-containing component; compression molding the resulting mixture; sintering the molded body in an non-oxidized atmosphere; and thermally treating the sintered body in an oxygen-containing atmosphere, whereby residual carbon is removed from the sintered body through oxidization, and the porous composite ceramic sintered body comprises an aluminum nitride phase and an aluminum oxynitride phase.

The composite ceramic sintered body according to the present invention is different from the conventional porous aluminum nitride sintered bodies composed of a single aluminum nitride phase in that the invention ceramic sintered body comprises the aluminum nitride phase as well as the aluminum oxynitride phase.

When the porous composite ceramic body according to the present invention is used as an electric material or a structural material, ceramic parts having good heat impact resistance can be produced without suffering from poor machinability unlike a case that such ceramic parts are produced from the conventional porous aluminum nitride ceramic sintered body. For, a gas having a pungent smell, such as ammonia, is not generated in the porous composite ceramic sintered body according to the present invention.

Reasons for the above are not clear, but are considered as follows:

That is, since the porous composite ceramic sintered body according to the present invention is composed of the aluminum nitride phase and an aluminum oxynitride phase, the toughness is higher as compared with the conventional porous aluminum nitride sintered body composed of a single aluminum nitride phase.

Further, the porous composite ceramic sintered body according to the present invention is produced through once having passed a compact sintered body, the particles are more firmly joined to the adjacent ones as compared with the conventional porous aluminum nitride sintered body. Furthermore, the heat conductivity of the porous composite ceramic sintered body according to the present invention is not so low as compared with the conventional porous aluminum nitride ceramic sintered body, since the heat conductivity of the aluminum oxynitride phase is not so poorer than that of the aluminum nitride phase and the particles are more firmly bonded to one another as compared with the conventional porous aluminum nitride ceramic sintered body.

Therefore, the porous composite ceramic sintered body according to the present invention has excellent heat impact resistance and mechanical strength.

As mentioned above, since the particles are firmly and extremely stably bonded to one another in the porous composite ceramic sintered body according to the present invention comprising an aluminum nitride phase and an aluminum oxynitride phase, AlN will not react with moisture in air, so that a substance having a pungent smell, such as ammonia, is not generated.

First, since the molded body is sintered in an non-oxidized atmosphere, the particles are firmly bonded to adjacent ones. Then, the sintered body is thermally treated in the oxygen-containing atmosphere, so that residual carbon is removed from the sintered body in the oxidative atmosphere. By so doing, the sintered body is changed to a porous product having an appropriate porosity depending upon the amount of the carbon added, etc.

In addition to the above-mentioned various aspects, the present invention is also to provide a porous composite ceramic sintered body comprising an aluminum nitride phase, an aluminum oxynitride phase and free carbon. This porous composite ceramic sintered body is obtained as an intermediate product of the first one. That is, this second porous ceramic sintered body is obtained by a process comprising the steps of: mixing a powder of aluminum nitride and a carbon-containing component; compression molding the resulting mixture; and sintering the molded body in an non-oxidized atmosphere; and thermally treating the sintered body in an oxidative atmosphere.

The following are preferable embodiments for this composite ceramic sintered body.

1) The free carbon is three-dimensionally connected to one another.
2) The open porosity of the porous composite ceramic sintered body is not more than 5%.

3) The volume resistivity of the porous composite ceramic sintered body is not more than 5%.

4) A ceramic sintered body can be obtained by electron discharge method.

These and other objects, features and advantages of the invention will be well appreciated upon reading of the following description of the invention when taken in conjunction with the attached drawings, with the understanding that some modifications, various and changes of the same could be easily made by the skilled person in the art.

BRIEF DESCRIPTION OF THE ATTACHED DRAWINGS

For a better understanding of the invention, reference is made to the attached drawings, wherein:

FIG. 5 is a sectional view outlining an electrostatic chuck with a heater; and

FIG. 6 is a sectional view outlining an electrostatic chuck according to a further embodiment of the present invention.

DETAILED DESCRIPTION OF THE INVENTION

Figure 1:
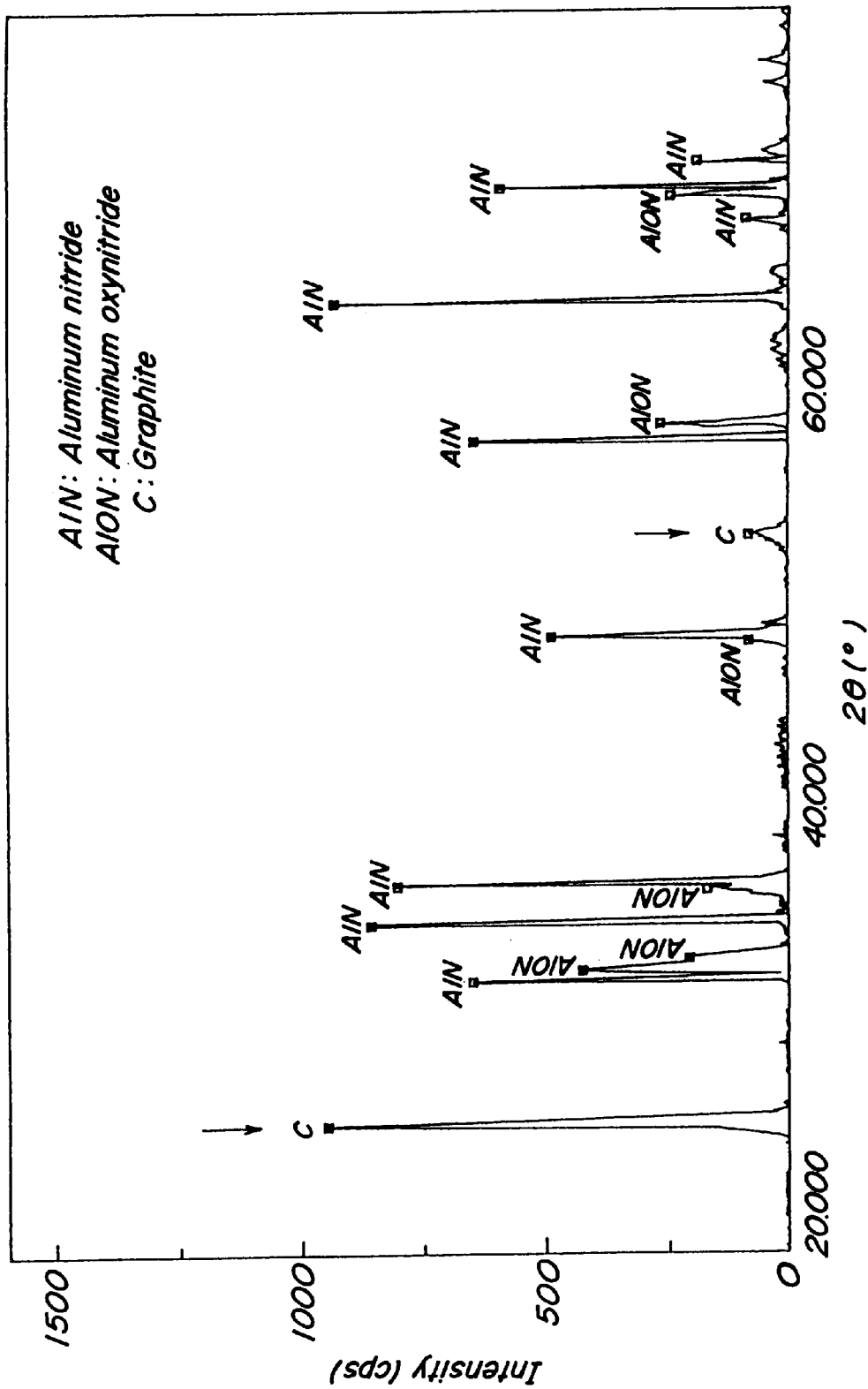
FIG. 1 is a graph showing an X-ray diffraction peak of a composite ceramic sintered body according to one embodiment of the present invention.

The present invention will be explained in more detail with reference to specific embodiments of the present invention.

The present invention relates to a porous composite ceramic sintered body comprising an aluminum nitride phase and an aluminum oxynitride phase, and further may contain, as an inevitable impurity, carbon originated from a carbon source used in the production of the porous composite ceramic sintered body.

The composite ceramic sintered body according to the present invention must be porous. The lower limit of the open porosity of the sintered body is preferably 10 vol. %, and more preferably 25 vol. %. The open porosity is unfavorably less than 10 vol. %, because gas permeability is poor in this case.

The upper limit of the open porosity of the sintered body is preferably 65 vol. %, and more preferably 45 vol. %. The open porosity is unfavorably more than 65 vol. %, because toughness and heat conductivity become smaller in this case so that excellent heat impact resistance or machining property cannot be realized.

Further, the lower limit of the ratio of the aluminum oxynitride phase to the sum of the aluminum nitride phase and an aluminum oxynitride phase of the composite ceramic sintered body is preferably 0.01, and more preferably 0.1. If the above ratio is less than 0.1, the toughness of the composite ceramic sintered body is lowered, so that excellent machining property cannot be realized.

Furthermore, the upper limit of the ratio of the aluminum oxynitride phase to the sum of the aluminum nitride phase and an aluminum oxynitride phase of the composite ceramic sintered body is preferably 0.75, and more preferably 0.60. The above ratio is unfavorably more than 0.75, because the heat conductivity of the composite ceramic sintered body is lowered in this case.

B/(A+B) is defined as the rate of the aluminum oxynitride phase to the sum of the aluminum nitride phase and the aluminum oxynitride phase in which A is a sum of areas of peak intensities of the aluminum nitride phase and B is a sum of areas of peak intensities of the aluminum oxynitride when measured in an range of $2\theta=30°-40°$ in X-ray diffraction with CuK$\alpha$ line.

The process for producing the porous composite ceramic sintered body according to the present invention is not particularly limited to any specific one. The porous composite ceramic sintered body is preferably produced as follows:

Powdery aluminum nitride and a carbon-containing component, and further preferably a sintering aid such as a rare earth element oxide such as yttrium oxide and erbium oxide or calcium carbonate are mixed by using a pot mill.

The above mixing may be effected for the starting materials only in a so-called dry mixing way, and the starting materials may be more uniformly mixed in an organic solvent such as isopropyl alcohol (hereinafter referred to as "IPA") in a so-called wet mixing way.

The aluminum nitride powder to be used in the present invention is produced by a reduction nitriding process or a direct reducing process.

The carbon-containing source to be used may be amorphous carbon such as graphite or carbon black, carbide such as boron carbide, organic material such as cellulose or a material which finally gives carbon by firing to react hydrogen and oxygen and evaporate the resultant.

Next, the resulting mixture is charged into a given mold, and the mold is placed in a press where a molded body is produced by applying a given molding pressure to the mold.

In order to obtain the molding body having a uniform molded density, it may be that the mixture is preliminarily molded as mentioned above, and then the final molded body is produced by a cold isotactic press (CIP).

Then, the molded body thus obtained is sintered by hot press or hot isostatic press (HIP). It is particularly preferable to employ the hot press from the standpoint of the cost reduction.

Further, in order to ensure sufficient toughness and heat conductivity of the finally obtained porous composite ceramic sintered body, the open porosity of the finally sintered body is preferably not more than 5%, and more preferably 1%.

FIG. 1 is a graph showing an X-ray diffraction peak pattern of the sintered body obtained by the above sintering as one embodiment of the present invention.

Figure 3:
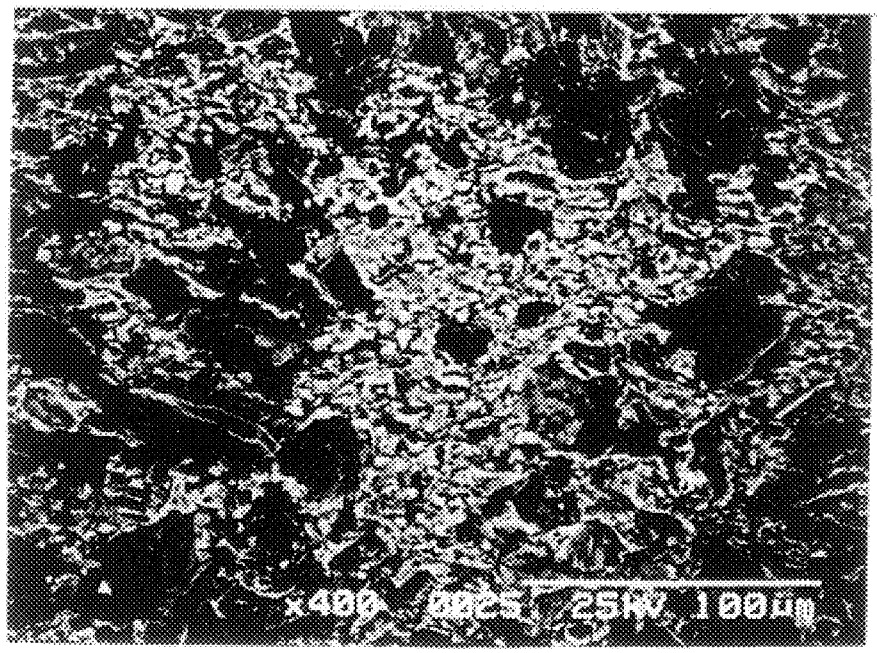
FIG. 3 is a photograph showing an electron-reflected image of the composite ceramic sintered body according to the above one embodiment of the present invention.

FIG. 3 is a backscattered electronic image of a section of the sintered body as one embodiment of the present invention.

The diffraction peak pattern in FIG. 1 can be explained by overlapped diffraction patterns of aluminum nitride in JCPDS card No. 25-1133, aluminum oxynitride in JCPDS card No. 35-0830, and graphite in JCPDS card No. 26-1079.

That is, it is seen that the above sintered body is constituted by the aluminum nitride phase, the aluminum oxynitride phase and free carbon such as graphite.

Also, it is seen in FIG. 3 that graphite as free carbon shown there by black portions exists between the aluminum nitride phase the aluminum oxynitride phase shown there by gray portions.

In the present invention, the aluminum nitride ceramic sintered body is produced by sintering in a non-oxidizing atmosphere as mentioned above. The reason why the aluminum oxynitride phase is nevertheless present in the sintered body is considered to be that oxide solid-solved or attached to the carbon source used for producing the aluminum nitride ceramic sintered body as an impure material reacts with aluminum nitride during the sintering.

Further, it is seen in FIG. 3 that free carbon particles are three-dimensionally continued to one another. When the free carbon particles are three-dimensionally connected to one another, in the thermal treatment mentioned later, they can be easily removed and further the porous composite ceramic sintered body having a desired open porosity can be easily obtained.

Further, the volume resistivity of the sintered body is preferably 0.01 to 10,000 Ωcm, and more preferably 0.1 to 100 Ωcm so as to enable the sintered body to be machined using the electron discharge method.

Next, the thus sintered body is thermally treated. This thermal treatment is effected to remove the free carbon as mentioned above.

That is, the sintered body is heated in the oxidizing atmosphere up to 500–900° C., preferably 600–800° C., and held there for 1–100 hours, preferably 2–20 hours. Consequently, carbon dioxide ($CO_2$) is formed through reaction between the free carbon in the sintered body and oxygen in the sintering atmosphere, so that this carbon dioxide goes up to the surface of the sintered body through open pores formed therein and thus is removed from the sintered body.

Since the thermally treating temperature is sufficiently low as compared with the sintering temperature, the composite ceramic sintered body is not further sintered in the thermally treating step.

Figure 2:
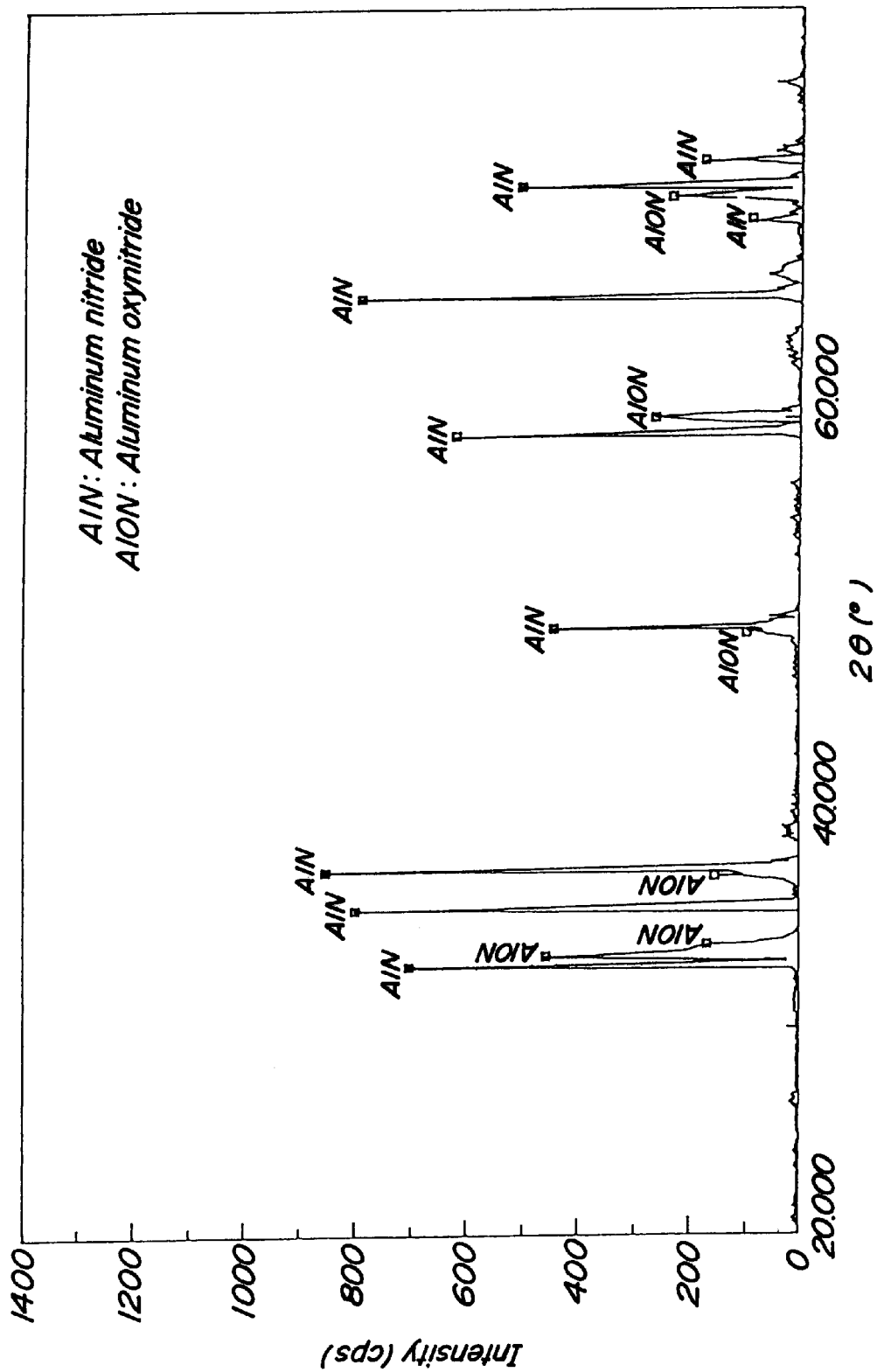
FIG. 2 is a graph showing an X-ray diffraction peak of a porous composite ceramic sintered body according to another embodiment of the present invention.

FIG. 2 is a graph showing an X-ray diffraction peak pattern of the porous composite ceramic sintered body according to one embodiment of the present invention.

The diffraction peak pattern in FIG. 2 can be explained by overlapped diffraction patterns of aluminum nitride in JCPDS card No. 25-1133 and aluminum oxynitride in JCPDS card No. 35-0830.

That is, the porous composite ceramic sintered body according to the present invention is constituted by the aluminum nitride phase and the aluminum oxynitride phase.

It is seen that since no peak of the free carbon is observed, the free carbon is effectively removed in the above thermally treating step.

Figure 4:
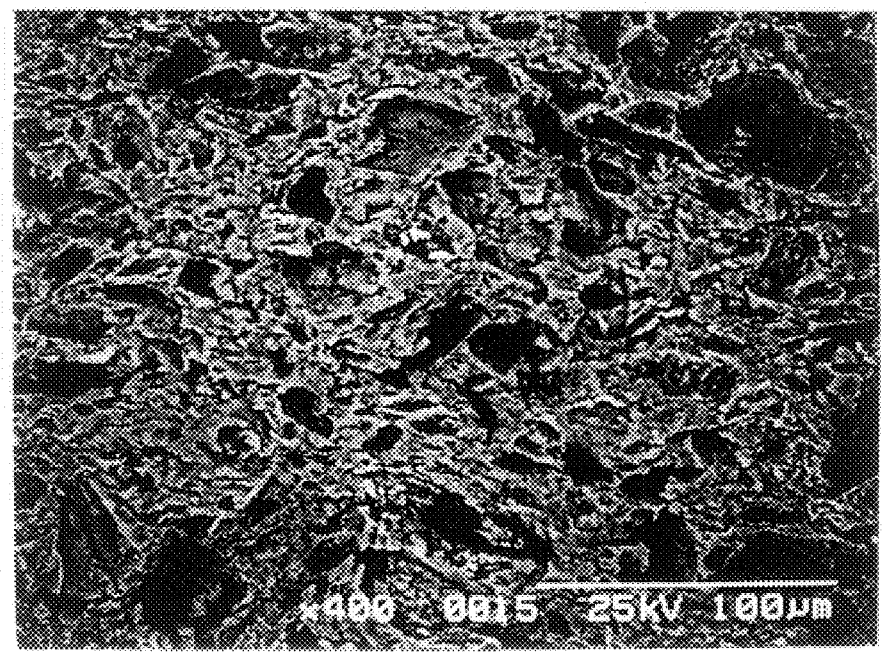
FIG. 4 is a photograph showing an electron-reflected image of the porous composite ceramic sintered body according to said another embodiment of the present invention.

A reflected electron image of the sintered body thus thermally treated is shown in FIG. 4 where the black portions in which the free carbon existed are present as voids to form open pores.

The porous composite ceramic sintered body according to the present invention can be obtained by effecting the above steps.

The open porosity of the porous composite ceramic sintered body according to the present invention depends upon the content of the carbon-containing component mixed in the process, the molding condition, the sintering condition, etc.

If the content of the carbon-containing component is increased, the open porosity increases due to the increase in the amount of the free carbon removed later.

Further, the porous composite ceramic sintered body having a smaller open porosity can be obtained by raising the molding pressure.

If the sintering temperature is low and the sintering time is short, the sintering does not highly proceed so that the porous composite ceramic sintered body having a smaller open porosity can be obtained.

When a product is to be produced from the composite ceramic sintered body according to the present invention, the composite body may be machined after the composite ceramic sintered body is made porous. However, in this case, there is a problem that worked pieces enter pores of the sintered body. For this reason, it is preferable that after the non-porous sintered body is finished to a given product by given machining, the finished sintered body is thermally treated in the oxidizing atmosphere.

As mentioned above, since the composite ceramic sintered body is often used as a relatively fine product such as an electric material, it is preferable in this case that the sintered body is subjected to electron discharge machining or the like.

Before the thermal treatment, the composite ceramic sintered body according to the present invention is a dense sintered body containing much free carbon, and exhibits relatively high conductivity because the free carbon particles are three-dimensionally connected one another. Therefore, the sintered body before the thermal treatment is extremely effectively electron discharge machined.

The porous composite ceramic sintered body thus produced can be used as an electronic material for a heat-emitting plate for a semiconductor or a circuit board and as a structural material for members in a semiconductor producing apparatus.

Among them, since the semiconductor-producing apparatus is exposed to a corrosive gas such as nitrogen trifluoride gas ($NF_3$) in an etching step or cleaning step in a semiconductor-producing process, the apparatus is particularly strongly required to have physical properties such as corrosion resistance. Therefore, the porous composite ceramic sintered body can be particularly preferably used for the members in such a semiconductor-producing apparatus.

FIG. 5 is a sectional view outlining a heater-provided electrostatic chuck as one example of the semiconductor apparatus.

A substrate 5 having an almost discoidal shape is provided with a ring-shaped flange 5c at a peripheral surface 5d, and an electrostatic chuck electrode 12 is buried in the substrate 5. A dielectric layer 3 having a given thickness is formed on such a surface 5a of the substrate 5 where a semiconductor wafer 2 is placed.

A terminal 7 is buried at a supporting side 4 of the substrate 5, and an end face of the terminal 7 is exposed from the rear surface 5b of the substrate 5. In order to effectively ensure the heat conduction between the semiconductor wafer 2 and the substrate 5, the substrate 5 is provided with gas introduction holes 6, at given locations, for the introduction of helium gas.

A positive pole of a DC power source 11 is connected to the terminal 7 via an electric line 10A, and a negative pole of the DC power source 11 is connected to the semiconductor wafer 2 via an electric line 10B.

A resistive heating member 8 is buried in the substrate 5 between the electrostatic chuck electrode 12 and the rear surface 5b of the substrate. Both ends of the resistive heating member 8 are connected to terminals 9, respectively, and the terminals 9 are connected to external terminals 14, respectively.

The resistive heating member 8 is to heat the semiconductor wafer 2 being adhered to the substrate 5, although not indispensable.

The porous composite ceramic sintered body according to the present invention is used at a location corresponding to the gas introduction hole 6 of the electrostatic chuck, the heat conductivity between the semiconductor wafer 2 and the substrate can be improved and a filtering effect can be afforded because the sintered body is porous.

In addition, when a corrosive gas introduction hole to a reaction chamber (not shown) is made of the porous composite ceramic sintered body, corrosion resistance and a filtering effect can be afforded to this gas introduction opening.

The present invention will be explained in more detail with reference to examples.

EXAMPLE 1

Powdery aluminum nitride obtained by a reduction nitriding process (Grade F, manufactured by Tokuyama Co., Ltd.) and graphite (Reagent CP, manufactured by Katayama Chemical Co., Ltd.) were measured at a weight ratio of 6:4, and mixed in a solvent of isopropyl alcohol (IPA) by using a pot mill, and then a mixed powder composed of aluminum nitride and graphite was obtained by evaporating IPA off.

Thereafter, the mixed powder was charged in a mold, and a cylindrical molded body having the diameter of 50 mm and the thickness of 20 mm was obtained by uniaxial press under a molding pressure of 200 $kgf/cm^2$.

Next, the molded body was placed in a graphite die where the molded body was kept at a temperature of 1900° C. in a reducing atmosphere under application of a pressure of 200 $kgf/cm^2$ for 2 hours.

The open porosity of this sintered body was measured by the Archimedes' method, and the volume resistivity was measured by a two-terminal method. Further, the phases constituting the sintered body were identified by the X-ray diffraction, and whether the sintered body could be electron discharge machined or not was examined. Results are shown in Table 1.

Next, the sintered body was thermally treated at 800° C. in open air for 10 hours, thereby obtaining a porous composite ceramic sintered body.

The open porosity of the porous composite ceramic sintered body was measured by the Archimedes' method. Further, the volume resistivity was measured by a two-terminal method. Further, the phases constituting the sintered body were identified by the X-ray diffraction as mentioned above, and the rate of the aluminum oxynitride phase was examined by the method explained before. Toughness was evaluated by the four-point bending method, and the heat conductivity was evaluated by the laser flush method.

In order to examine the generation of ammonia in the composite ceramic sintered body, the composite ceramic sintered body was immersed in water for one hour.

Results are shown in Table 2.

EXAMPLES 2 and 3

Examples 2 and 3 were conducted similarly with Example 1 except that the mixing weight ratio of powdery aluminum nitride and graphite was 4:6 or 8:2, respectively.

The open porosity and various physical properties of the composite ceramic sintered body and the porous composite ceramic sintered body were evaluated in the same manner as in Example 1. Results are also shown in Tables 1 and 2.

EXAMPLE 4

Example 4 was effected in the same manner as in Example 1, except that in addition to powdery aluminum nitride and graphite, yttrium oxide (manufactured by Shinetsu Chemical Co., Ltd) was used as a sintering aid, they were mixed at the weight ratio of 57:40:3, cold isostatic press was effected at 1000 $kgf/cm^2$ in a step of compression molding the mixed powder.

The open porosity and various physical properties of the composite ceramic sintered body and the porous composite ceramic sintered body were evaluated in the same manner as in Example 1.

Results are also shown in Tables 1 and 2.

EXAMPLE 5

A molded body having the same cylindrical shape as in Example 1 was obtained by measuring powdery aluminum nitride and graphite at a weight ratio of 7:3, preparing a paste through adding an appropriate amount of an organic binder to the mixed powder, and extruding the paste with an extruding die.

The sintering step was effected in the same manner as in Example 1 except that the sintered body was thermally effected at 700° C. for 20 hours.

The open porosity and various physical properties of the composite ceramic sintered body and the porous composite ceramic sintered body were evaluated in the same manner as in Example 1. Results are also shown in Tables 1 and 2.

EXAMPLE 6

A molded body having a cylindrical shape was produced in the same manner as in Example 5 except that in addition to powdery aluminum nitride and graphite, calcium carbonate (manufactured by Nichia Kagaku Co., Ltd.) was used as a sintering aid, they were measured and mixed at a weight ratio of 55:40:5.

The molded body thus obtained was hot pressed in the same manner as in Example 1 except that the temperature was set at 1850° C.

Then, a porous composite ceramic sintered body was obtained by thermally treating the sintered body at 700° C. in air for 20 hours.

The open porosity and various physical properties of the composite ceramic sintered body and the porous composite ceramic sintered body were evaluated in the same manner as in Example 1. Results are also shown in Tables 1 and 2.

EXAMPLE 7

Cellulose and erbium oxide were used as a carbon-containing component and a sintering aid, respectively.

The same powdery aluminum nitride as in the above Examples, these cellulose and erbium oxide were mixed at a weight ratio of 19:80:1, and a molded body having a cylindrical shape with the diameter of 50 mm and the thickness of 20 mm was obtained in the same manner as in Example 4.

Next, the molded body was hot pressed at a temperature of 1950° C. in a reducing atmosphere for 2 hours, and then thermally treated at 800° C. in oxygen atmosphere for 10 hours.

The various physical properties of the composite ceramic sintered body obtained from the molded body were measured in the same manner as in Example 1. Results are shown in Table 1. The various physical properties of the porous composite ceramic sintered body were measured in the same manner as in Example 1. Results are shown in Table 2.

EXAMPLE 8

Example 8 was effected in the same manner as in Example 1 except that the hot press was effected at a temperature of 1800° C. for 2 hours, and the thermal treatment was effected in oxygen atmosphere at 700° C. for 20 hours.

Various physical properties of the composite ceramic sintered body and the porous composite ceramic sintered body were evaluated in the same manner as in Example 1. Results are also shown in Tables 1 and 2.

EXAMPLE 9

An electrode was buried in an electrostatic chuck molded body made of powdery aluminum nitride in a configuration shown in FIG. 5, and an electrostatic chuck sintered body was produced by hot pressing the molded body at 1900° C. for 4 hours. The electrode used in this Example a metal net electrode having a configuration of FIG. 6 obtained by knitting molybdenum wires with a diameter of 0.12 mm at a density of 50 wires per inch.

Four straight through-holes each having a diameter of 3 mm and corresponding to the gas introduction holes 6 in FIG. 5 were concentrically formed in the thus obtained electrostatic chuck sintered body.

On the other hand, 3 mm-diameter pins were produced from a composite ceramic sintered body produced in the same manner as in Example 1 and having not undergone the thermal treatment by electron discharge machining.

These pins were inserted into the straight through-holes of the sintered body, and hot pressed again, thereby diffusion bonding the pins to the electrostatic chuck sintered body.

Then, the sintered body was thermally treated at 800° C. for 10 hours in air, thereby the pins porous through removal of free carbon present in the pins.

When the holes into which the porous pins were inserted were used as the gas introduction holes, the heat conductivity between the semiconductor wafer 2 and the substrate 5 was improved so that the temperature of the semiconductor wafer might be easily adjusted.

COMPARATIVE EXAMPLE 1

The same aluminum nitride as in the above Examples was used, and a molded body having a cylindrical shape of 50 mm in diameter and 20 mm in thickness was obtained from this powder in the same manner as in Example 4.

Next, this molded body was placed in a die made of boron nitride, and sintered at 1900° C. for 2 hours under an ordinary pressure in nitrogen atmosphere.

The open porosity and so on of the composite ceramic sintered body thus obtained were measured in the same manner as in Examples. Results are shown in Tables 1 and 2.

COMPARATIVE EXAMPLE 2

A composite ceramic sintered body was produced in the same manner as in Comparative Example 1, which was further thermally treated at 800° C. in air for 10 hours.

The open porosity and various physical properties of the composite ceramic sintered body and the porous composite ceramic sintered body were evaluated in the same manner as in Examples. Results are also shown in Tables 1 and 2.

COMPARATIVE EXAMPLE 3

The same powdery aluminum nitride and yttrium oxide as in Example 4 were used. They were measured at a weight ratio of 95:5, and the resulting mixture was molded in the same manner as in Example 1, thereby obtaining a molded body having a cylindrical shape with 50 mm in diameter and 20 mm in thickness.

Next, this molded body was sintered at 1700° C. for 2 hours under an ordinary pressure in nitrogen atmosphere.

The open porosity and various physical properties of the composite ceramic sintered body and the porous composite ceramic sintered body were evaluated in the same manner as in Examples. Results are also shown in Tables 1 and 2.

COMPARATIVE EXAMPLE 4

In addition to the above powdery aluminum nitride, the same calcium carbonate as in Example 6 was used, and they were measured at a weight ratio of 98:2, and mixed in the same manner as in Example 1.

An organic binder was added to the thus obtained mixed powder, and a molded body having a cylindrical shape of 5 mm in diameter and 20 mm in thickness was obtained by the same manner as in Examples 5 and 6.

Then, the thus obtained molded body was sintered at 1720° C. for 2 hours under an ordinary pressure in nitrogen atmosphere.

The open porosity and various physical properties of the composite ceramic sintered body and the porous composite ceramic sintered body were evaluated in the same manner as in Examples. Results are also shown in Tables 1 and 2.

COMPARATIVE EXAMPLE 5

For the above powdery aluminum nitride, carbon black (manufactured by Mitsubishi Chemical Co., Ltd.) was used as a carbon-containing component.

Next, they were measured at a weight ratio of 99.5:0.5, and mixed in the same manner as in Example 1. Then, a molded body having a cylindrical shape of 50 mm in diameter and 20 mm in thickness was obtained by pressing in the same manner as in Example 4.

The thus obtained molded body was sintered at 1900° C. for 2 hours under an ordinary pressure in nitrogen atmosphere.

The open porosity and various physical properties of the composite ceramic sintered body and the porous composite ceramic sintered body were evaluated in the same manner as in Examples. Results are also shown in Tables 1 and 2.

It is seen from Table 1 that the composite ceramic sintered bodies having undergone no thermal treatment in Examples were constituted by the aluminum nitride phase, the aluminum oxynitride phase and the free carbon phase. On the other hand, as shown in Comparative Example, it is seen that no carbon-containing component was used or a very small amount of it was used, the aluminum nitride sintered bodies were constituted by the aluminum nitride phase alone.

Further, the composite ceramic sintered bodies in Examples exhibited lower volume resistivities as compared with the aluminum nitride ceramic sintered bodies in Comparative Examples. As seen in the photograph of FIG. 3, it is considered that this indicates free carbon exhibiting good conductivity exists three-dimensionally between the aluminum nitride phase and the aluminum oxynitride phase.

Therefore, the composite ceramic sintered body having undergone no thermal treatment can be electron discharge machined, because the sintered body exhibits good conductivity.

It is seen from Table 2 that the porous composite ceramic sintered body according to the present invention is constituted by the aluminum nitride phase and the aluminum oxynitride phase. On the other hand, as shown in Comparative Example, it is seen that no carbon-containing component was used or a very small amount of it was used, the aluminum nitride sintered bodies were constituted by the aluminum nitride phase alone.

It is seen that the porous composite ceramic sintered bodies in Examples, which have equal or higher open porosities as those of the sintered bodies in Comparative Examples, exhibit excellent strength and heat conductivity because the porous composite ceramic sintered bodies once passed their corresponding dense composite ceramic sintered bodies and the aluminum oxynitride phase existed.

Further, since the porous composite ceramic sintered bodies once passed the dense composite ceramic sintered bodies, no ammonia is generated even through contact between the porous ceramic and water.

TABLE 1

|  | Carbon content | Sintering atmosphere | Constituting phase | Open porosity (vol %) | Volume resistance ($\Omega$ cm) | Electron Discharge Machining |
|---|---|---|---|---|---|---|
| Example 1 | Graphite: 40 wt % | Reducing atmosphere | AlN, 27R, G | 0.5 | 2 | possible |
| Example 2 | Graphite: 60 wt % | Reducing atmosphere | AlN, 27R, G | 1.1 | 4 | possible |
| Example 3 | Graphite: 20 wt % | Reducing atmosphere | AlN, 27R, G | 0.2 | 0.5 | possible |
| Example 4 | Graphite: 40 wt % | Reducing atmosphere | AlN, 27R, G | 0.2 | 0.1 | possible |
| Example 5 | Graphite: 30 wt % (*) | Reducing atmosphere | AlN, 27R, G | 0.8 | 30 | possible |
| Example 6 | Graphite: 40 wt % (*) | Reducing atmosphere | AlN, 27R, G | 0.8 | 20 | possible |
| Example 7 | Cellulose: 80 wt % | Reducing atmosphere | AlN, 27R, G, AmC | 1.2 | 580 | possible |
| Example 8 | Graphite: 40 wt % | Reducing atmosphere | AlN, AlON, G | 0.8 | 4 | possible |
| Comparative Example 1 | — | Nitrogen | AlN | 20.4 | $>1 \times 10^{13}$ | impossible |
| Comparative Example 2 | — | Nitrogen | AlN | 20.4 | $>1 \times 10^{13}$ | impossible |
| Comparative Example 3 | — | Nitrogen | AlN | 34.9 | $>1 \times 10^{13}$ | impossible |
| Comparative Example 4 | — | Nitrogen | AlN | 38.3 | $>1 \times 10^{13}$ | impossible |
| Comparative Example 5 | Carbon black: 0.5 wt % | Reducing atmosphere | AlN | 28.6 | $>1 \times 10^{13}$ | impossible |

Note:
(1): (*) means that an organic binder is contained as a mixing component.
(2): AlN means the aluminum nitride phase, 27R means a 27R phase of aluminum oxynitride, AlON means the γ phase of aluminum oxynitride, G means the graphite phase, and AmC means an amorphous carbon phase.

TABLE 2

|  | Heating atmosphere | Constituting phase | Percentage of an aluminate nitride | Open porosity (vol %) | Four-point bending strength (MPa) | Heat conductivity (W/m · K) | Generation of ammonia |
|---|---|---|---|---|---|---|---|
| Example 1 | Open air | AlN, 27R | 0.25 | 41.6 | 101 | 35 | not generated |
| Example 2 | Open air | AlN, 27R | 0.48 | 61.3 | 71 | 25 | not generated |
| Example 3 | Open air | AlN, 27R | 0.15 | 15.3 | 203 | 42 | not generated |
| Example 4 | Open air | AlN, 27R | 0.30 | 36.5 | 123 | 25 | not generated |
| Example 5 | Open air | AlN, 27R | 0.22 | 35.2 | 132 | 38 | not generated |
| Example 6 | Open air | AlN, 27R | 0.33 | 18.2 | 198 | 41 | not generated |
| Example 7 | Oxygen | AlN, 27R | 0.08 | 29.8 | 98 | 35 | not generated |
| Example 8 | Open air | AlN, AlON | 0.05 | 39.7 | 99 | 39 | not generated |
| Comparative Example 1 | — | AlN | 0 | 20.4 | 81 | 28 | generated |
| Comparative Example 2 | Open air | AlN | 0 | 19.9 | 82 | 28 | generated |
| Comparative Example 3 | — | AlN | 0 | 34.9 | 55 | 33 | generated |
| Comparative Example 4 | — | AlN | 0 | 38.3 | 62 | 36 | generated |
| Comparative Example 5 | — | AlN | 0 | 28.6 | 73 | 21 | generated |

Note:
(1): AlN means the aluminum nitride phase, 27R means the 27R phase of aluminum oxynitride, and AlON means γ phase of aluminum oxynitride.

As mentioned above, the porous composite ceramic sintered body according to the present invention once passes its dense composite ceramic sintered body and has the aluminum oxynitride phase in addition to the aluminum nitride phase, heat impact resistance and machining workability are excellent despite of high open porosity, and a pungent smell gas such as ammonia is not generated.

What is claimed is:

1. A porous composite ceramic sintered body comprising an aluminum nitride phase and an aluminum oxynitride phase, wherein said body has an open porosity of 10 to 65 vol. %.

2. The porous composite ceramic body of claim 1, wherein a ratio of said aluminum oxynitride relative to the total amount of the aluminum nitride phase and the aluminum oxynitride phase is 0.01 to 0.75.

* * * * *